US009496369B2

(12) United States Patent
Wu et al.

(10) Patent No.: US 9,496,369 B2
(45) Date of Patent: Nov. 15, 2016

(54) METHOD OF FORMING SPLIT-GATE MEMORY CELL ARRAY ALONG WITH LOW AND HIGH VOLTAGE LOGIC DEVICES (71) Applicant: Silicon Storage Technology, Inc., San Jose, CA (US)

(72) Inventors: Man-Tang Wu, Hsinchu County (TW); Jeng-Wei Yang, Zhubei (TW); Chien-Sheng Su, Saratoga, CA (US); Chun-Ming Chen, Taipei (TW); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/002,307

(22) Filed: Jan. 20, 2016

(65) Prior Publication Data

US 2016/0218195 A1     Jul. 28, 2016

Related U.S. Application Data (60) Provisional application No. 62/106,531, filed on Jan. 22, 2015.

(51) Int. Cl.
*H01L 21/336* (2006.01)
*H01L 29/66* (2006.01)
*H01L 29/423* (2006.01)
*H01L 27/115* (2006.01)

(52) U.S. Cl.
CPC ... *H01L 29/66537* (2013.01); *H01L 27/11519* (2013.01); *H01L 27/11546* (2013.01); *H01L 29/42328* (2013.01); *H01L 29/66825* (2013.01)

(58) Field of Classification Search
None
See application file for complete search history.

(56) References Cited

U.S. PATENT DOCUMENTS

| 7,390,718 | B2* | 6/2008 | Roizin | H01L 27/105 257/E21.645 |
| 7,868,375 | B2* | 1/2011 | Liu | H01L 21/28273 257/320 |
| 8,173,514 | B2* | 5/2012 | Ogura | H01L 21/76224 438/400 |
| 9,082,865 | B2* | 7/2015 | Yu | H01L 29/788 |
| 9,214,354 | B2* | 12/2015 | Ishida | H01L 27/11573 |
| 9,224,745 | B2* | 12/2015 | Torii | H01L 21/28273 |
| 9,269,766 | B2* | 2/2016 | Wu | H01L 21/76802 |
| 9,412,599 | B2* | 8/2016 | Ishida | H01L 21/823462 |

(Continued)

*Primary Examiner* — David E Graybill
(74) *Attorney, Agent, or Firm* — DLA Piper LLP (US)

(57) ABSTRACT

A method of forming a memory device on a substrate having memory, LV and HV areas, including forming pairs of spaced apart memory stacks in the memory area, forming a first conductive layer over and insulated from the substrate, forming a first insulation layer on the first conductive layer and removing it from the memory and HV areas, performing a conductive material deposition to thicken the first conductive layer in the memory and HV areas, and to form a second conductive layer on the first insulation layer in the LV area, performing an etch to thin the first conductive layer in the memory and HV areas and to remove the second conductive layer in the LV area, removing the first insulation layer from the LV area, and patterning the first conductive layer to form blocks of the first conductive layer in the memory, LV and HV areas.

6 Claims, 9 Drawing Sheets (56) References Cited

U.S. PATENT DOCUMENTS

| | | | | |
|---|---|---|---|---|
| 9,412,755 | B2* | 8/2016 | Ishida | H01L 21/28282 |
| 2005/0186741 | A1* | 8/2005 | Roizin | H01L 27/105 |
| | | | | 438/275 |
| 2009/0215243 | A1* | 8/2009 | Ogura | H01L 21/76224 |
| | | | | 438/435 |
| 2010/0054043 | A1* | 3/2010 | Liu | H01L 21/28273 |
| | | | | 365/185.29 |
| 2012/0299056 | A1* | 11/2012 | Arai | H01L 29/404 |
| | | | | 257/144 |
| 2013/0171814 | A1* | 7/2013 | Torii | H01L 21/28273 |
| | | | | 438/593 |
| 2013/0242659 | A1* | 9/2013 | Yu | H01L 29/788 |
| | | | | 365/185.14 |
| 2015/0084111 | A1* | 3/2015 | Wu | H01L 21/76802 |
| | | | | 257/316 |
| 2015/0171101 | A1* | 6/2015 | Ishida | H01L 21/28282 |
| | | | | 438/275 |
| 2015/0171102 | A1* | 6/2015 | Ishida | H01L 21/823462 |
| | | | | 438/587 |
| 2015/0171103 | A1* | 6/2015 | Ishida | H01L 27/11573 |
| | | | | 438/424 |
| 2016/0043095 | A1* | 2/2016 | Yang | H01L 29/42328 |
| | | | | 257/319 |
| 2016/0126327 | A1* | 5/2016 | Chen | H01L 29/4916 |
| | | | | 257/326 |
| 2016/0148944 | A1* | 5/2016 | Yu | H01L 27/11541 |
| | | | | 438/258 |
| 2016/0163722 | A1* | 6/2016 | Chang | H01L 27/11521 |
| | | | | 257/316 |
| 2016/0181266 | A1* | 6/2016 | Chuang | H01L 27/11526 |
| | | | | 257/316 |
| 2016/0218110 | A1* | 7/2016 | Yang | H01L 21/30604 |

* cited by examiner

METHOD OF FORMING SPLIT-GATE MEMORY CELL ARRAY ALONG WITH LOW AND HIGH VOLTAGE LOGIC DEVICES

RELATED APPLICATIONS

This application claims the benefit of U.S. Provisional Application No. 62/106,531, filed Jan. 22, 2015.

FIELD OF THE INVENTION

The present invention relates to non-volatile memory cell arrays.

BACKGROUND OF THE INVENTION

It is well known in the art to form split-gate memory cells as an array of such cells. For example, U.S. Pat. No. 7,868,375 discloses an array of memory cells, where each memory cell includes a floating gate, a control gate, a select gate, an erase gate, all formed on a substrate with a channel region defined between a source and drain regions. For efficient use of space, the memory cells are formed in pairs, with each pair sharing a common source region and erase gate.

It is also known to form both low voltage and high voltage logic devices on the same wafer die as the array of memory cells. Such logic devices can include transistors each having a source and drain, and a poly gate controlling the conductivity of the channel region between the source and drain. Conventional logic device formation includes forming the poly gate first (preferably forming the memory cell erase and select gates, and forming the logic device poly gates, using the same poly deposition processing), followed by an LDD implant to form the source and drain regions, whereby the source/drain regions are self-aligned to the poly gate. The poly gate blocks prevent any of the implant from reaching the channel region under the gate. High voltage logic devices are designed to operate at higher voltages, and are typically made by using a higher LDD implant energy so that the source/drain regions formed thereby have a higher breakdown voltage.

One problem is that as device geometries continue to scale down to smaller sizes, the poly gates for the logic devices are becoming too thin to effectively block the HV LDD implant, which can penetrate through the relatively thin poly gate and into the channel region (which adversely affects performance). The conventional solution is to lower the implant energy for the HV LDD implant to prevent such poly layer penetration. However, the lower implant energy results in a lower gated-diode breakdown voltage, thus undesirably limiting the operational voltage of high voltage transistors.

BRIEF SUMMARY OF THE INVENTION

The aforementioned problems and needs are addressed by a method of forming a memory device. The method includes providing a silicon substrate (wherein the substrate has a memory area, an LV area and an HV area which are insulated from each other by insulation material extending into a surface of the substrate, and wherein the substrate has a first conductivity type), forming pairs of spaced apart memory stacks on the substrate and in the memory area (wherein each memory stack includes a floating gate disposed over and insulated from the substrate, and a control gate disposed over and insulated from the floating gate), forming a first conductive layer over and insulated from the substrate in the memory area, the LV area and the HV area (wherein the first conductive layer extends up and over the pairs of memory stacks), forming a first insulation layer on the first conductive layer in the memory area, the LV area and the HV area, removing the first insulation layer from the memory area and the HV area, while maintaining the first insulation layer in the LV area, performing a conductive material deposition to thicken the first conductive layer in the memory area and the HV area, and to form a second conductive layer on the first insulation layer in the LV area, performing an etch to thin the first conductive layer in the memory area and the HV area and to remove the second conductive layer in the LV area (wherein a top surface of the first conductive layer in the memory area and the HV area is higher than a bottom surface of the first insulation layer in the LV area), removing the first insulation layer from the LV area, and patterning the first conductive layer to form blocks of the first conductive layer in the memory area, the LV area and the HV area (wherein the blocks of the first conductive layer in the LV area have a height less than that of the blocks of the first conductive layer in the HV area).

Other objects and features of the present invention will become apparent by a review of the specification, claims and appended figures.

DETAILED DESCRIPTION OF THE INVENTION

The present invention is a technique for forming low and high voltage logic devices on the same wafer die as the memory cell array, whereby sufficiently high voltage implantation can be employed to fabricate the high voltage logic devices without penetrating the high voltage logic device poly gate.

Figure 1A:
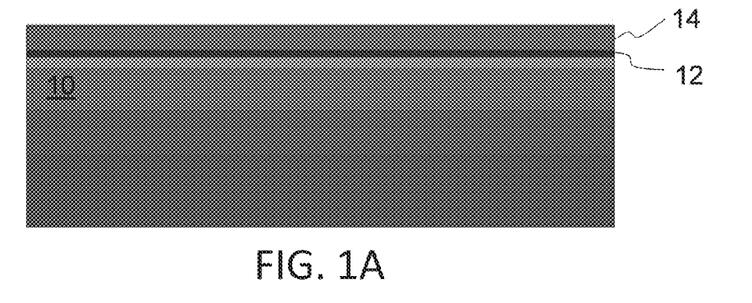
FIGS. 1A-1P are side cross sectional views illustrating the steps of forming the memory device of the present invention.
Figure 1B:
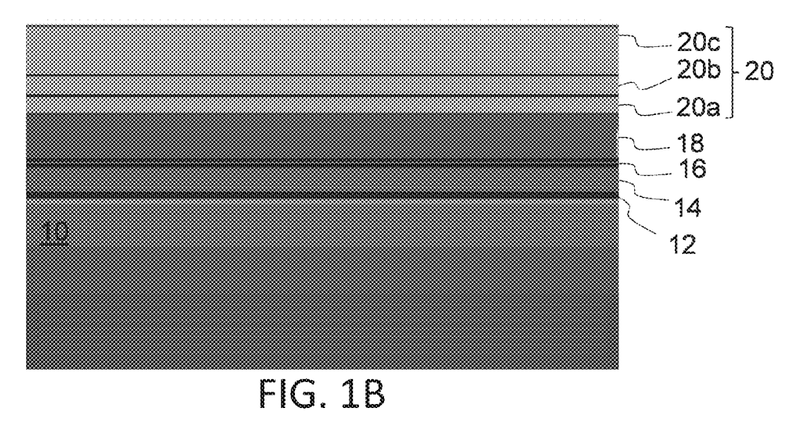
Figure 1C:
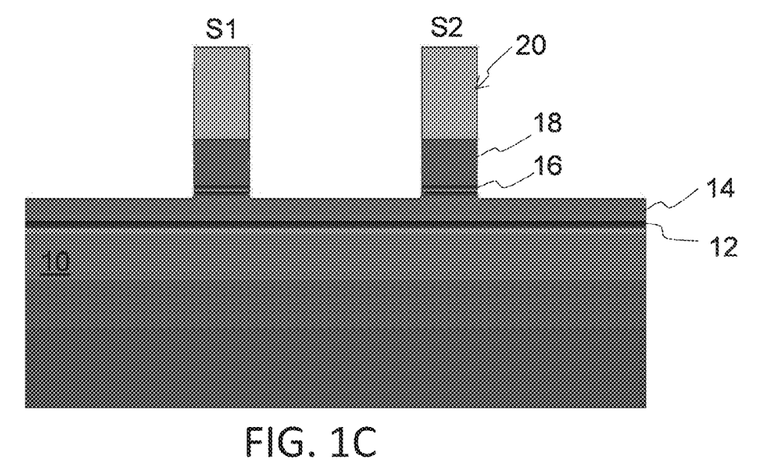
Figure 1D:
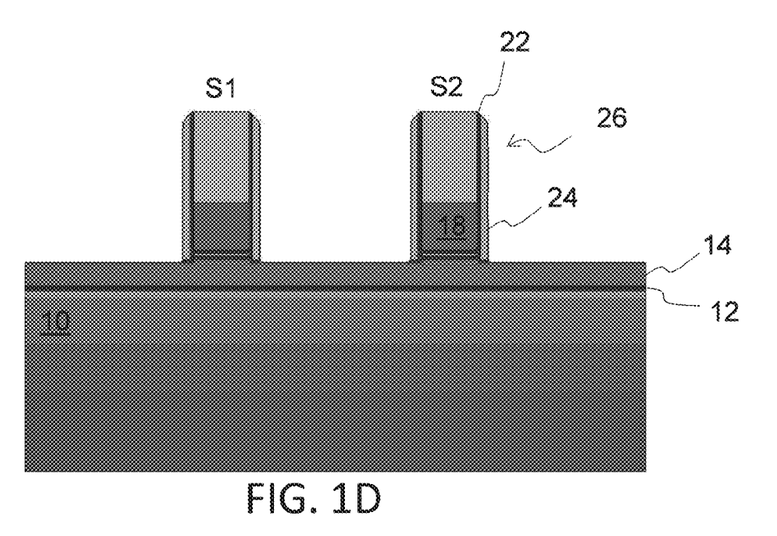
Figure 1E:
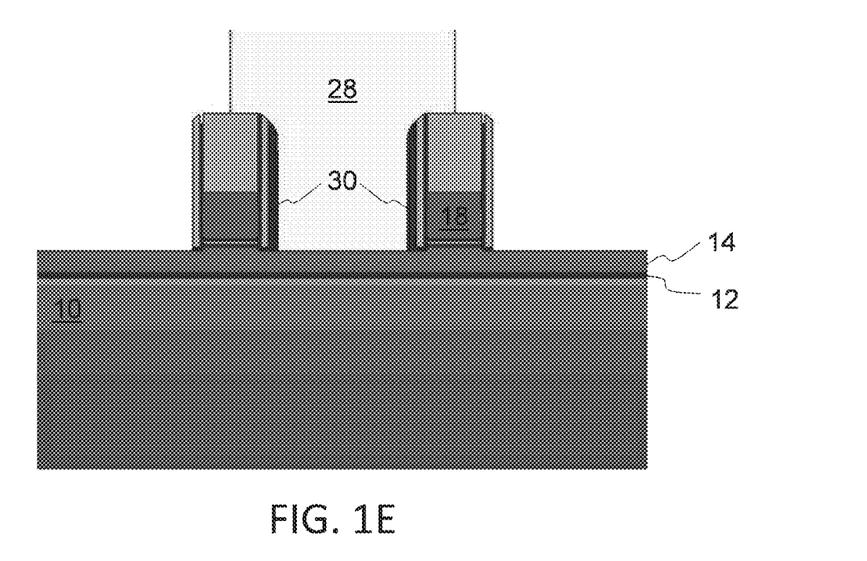
Figure 1F:
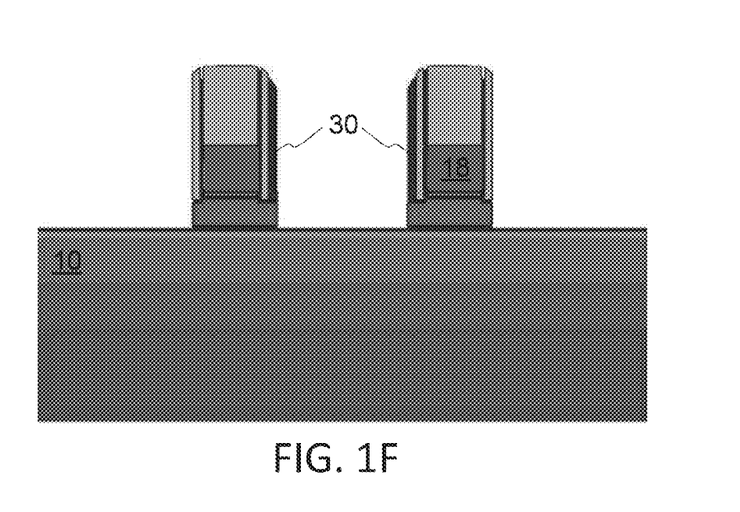
Figure 1G:
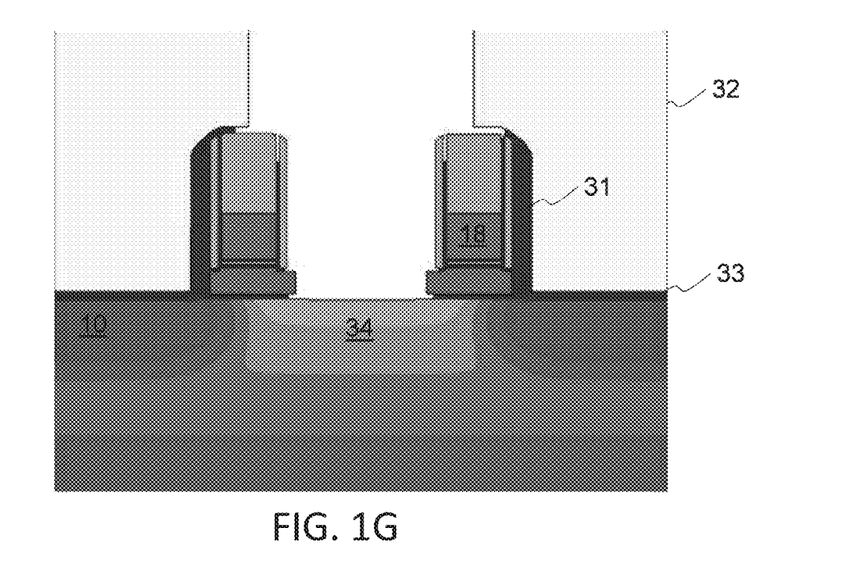
Figure 1H:
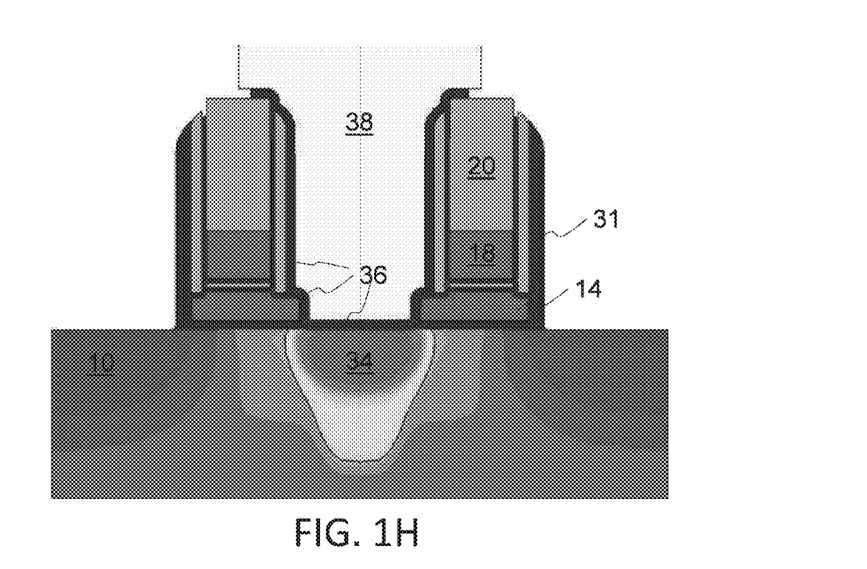
Figure 1I:
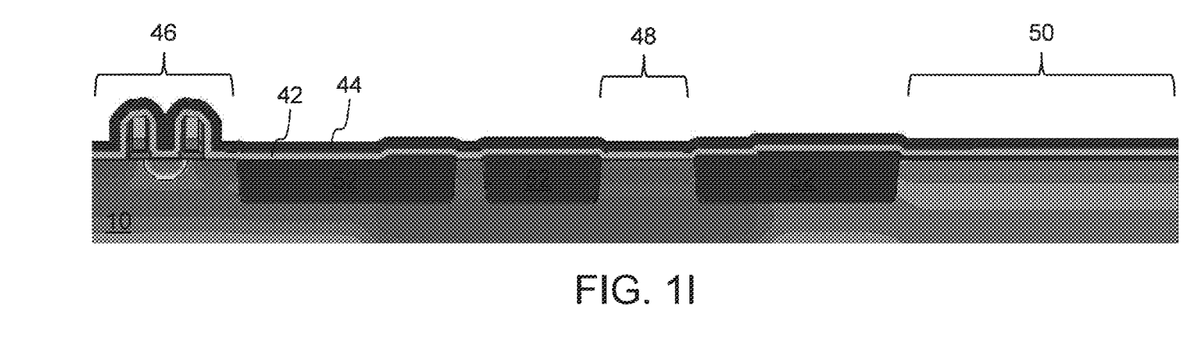
Figure 1J:
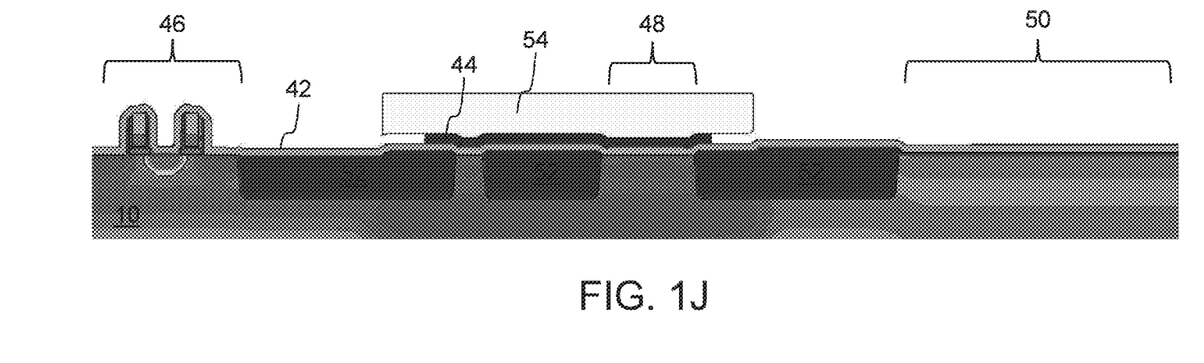
Figure 1K:
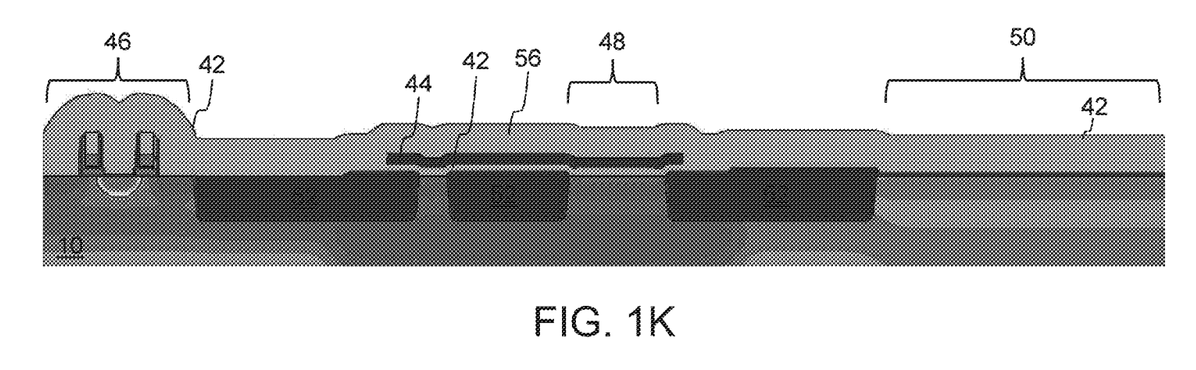
Figure 1L:
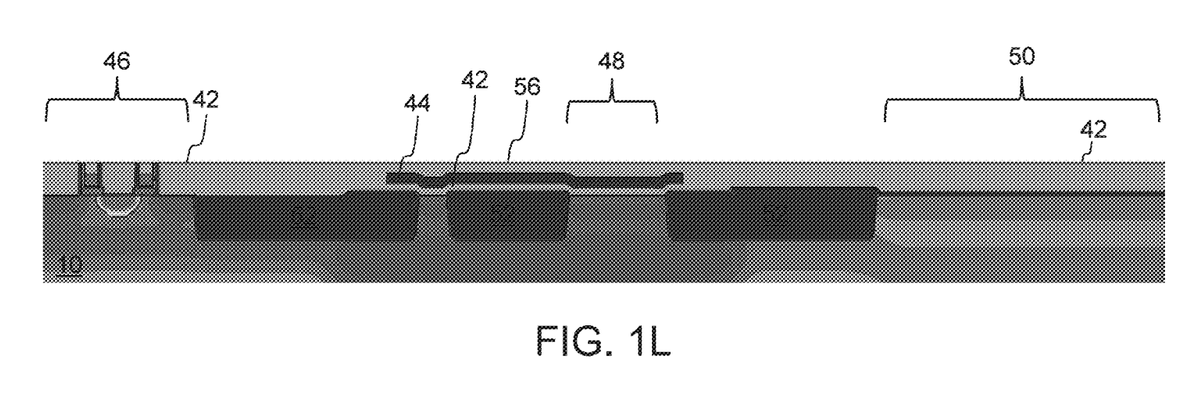
Figure 1M:
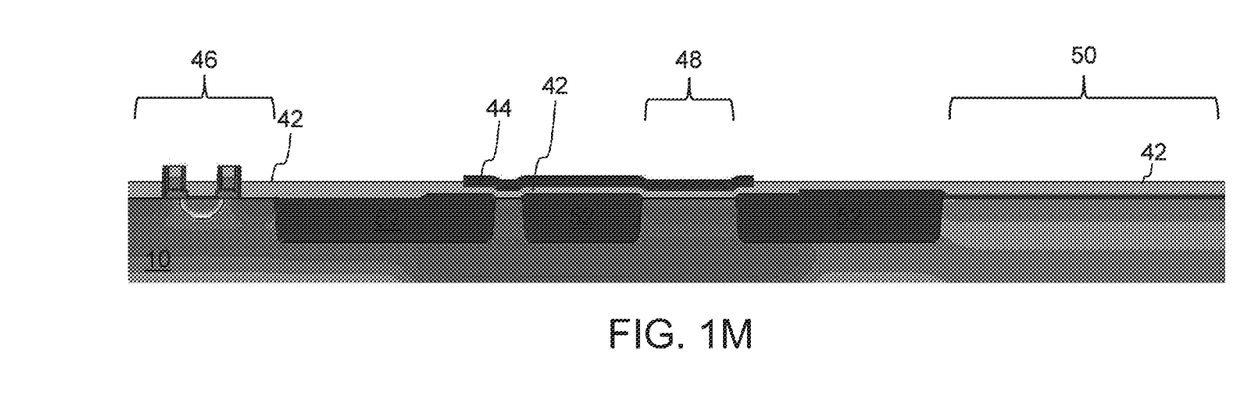
Figure 1N:
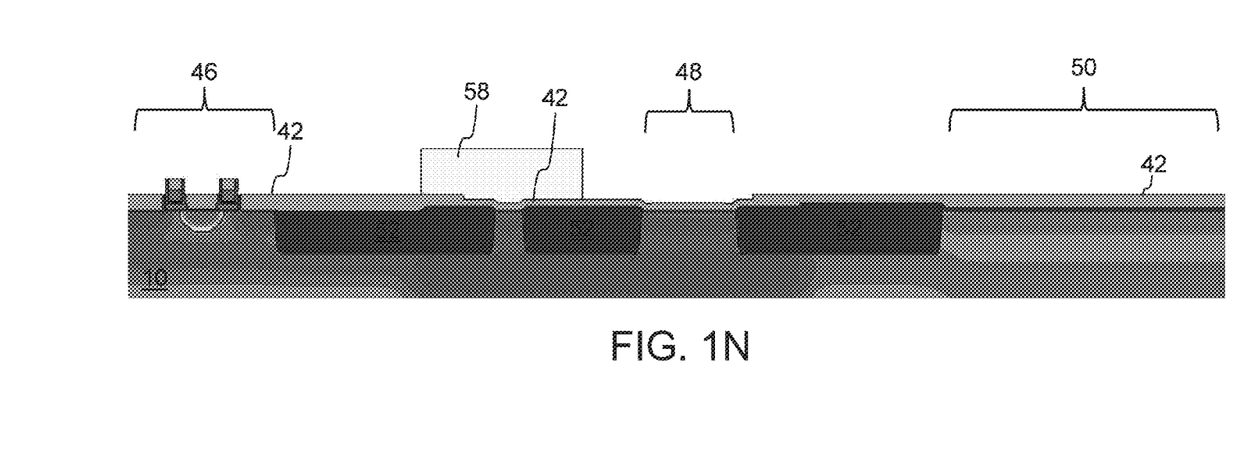
Figure 1O:
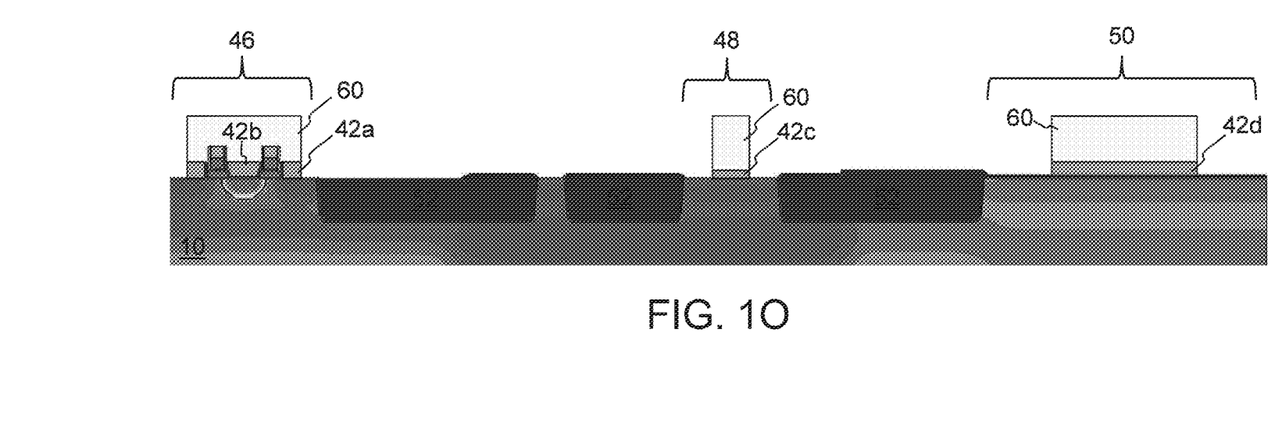
Figure 1P:
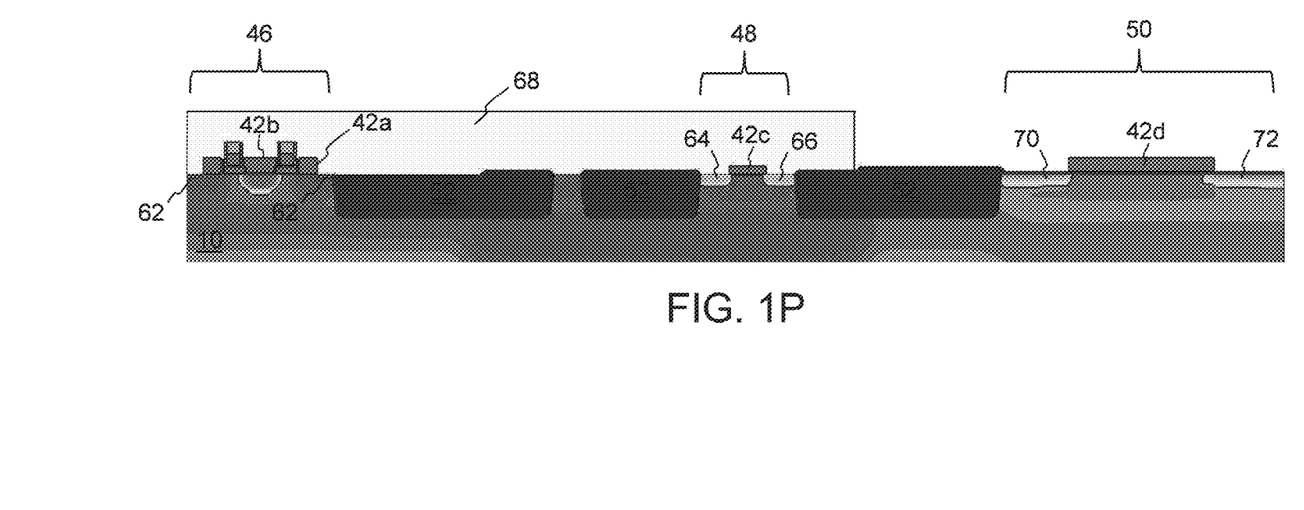

Referring to FIGS. 1A-1P there are shown cross-sectional views of the steps in the process to make a memory cell and low/high voltage logic devices on the same wafer. The process begins by forming a layer of silicon dioxide (oxide) 12 on a substrate 10 of P type single crystalline silicon. Thereafter a first layer 14 of polysilicon (or amorphous silicon) is formed on the layer 12 of silicon dioxide, as illustrated in FIG. 1A. The first layer 14 of polysilicon is subsequently patterned in a direction perpendicular to the view of FIG. 1A.

Another insulating layer 16, such as silicon dioxide (or even a composite layer, such as ONO (oxide, nitride, oxide)) is formed on the first layer 14 of polysilicon. A second layer 18 of polysilicon is then formed on the oxide layer 16. Another insulating layer 20 is formed on the second layer 18 of polysilicon and used as a hard mask during subsequent dry etching. In the preferred embodiment, the layer 20 is a composite NON layer, comprising silicon nitride 20a, silicon dioxide 20b, and silicon nitride 20c. The resulting structure is shown in FIG. 1B. The hard mask may instead be a composite layer of silicon oxide 20b and silicon nitride 20c (omitting nitrite 20a). The hard mask may also instead be formed with a thick silicon nitride layer 20a only.

Photoresist material (not shown) is coated on the structure, and a masking step is performed exposing selected portions of the photoresist material. The photoresist is developed and using the photoresist as a mask, the structure is etched. Specifically, the composite layer 20, the second layer 18 of polysilicon, and the insulating layer 16 are anisotropically etched, until the first layer 14 of polysilicon is exposed. The resultant structure is shown in FIG. 1C. Although only two "stacks" (S1 and S2) are shown, it should be clear that there are a number of such "stacks" that are separated from one another.

Silicon dioxide 22 is formed on the structure. This is followed by the formation of silicon nitride layer 24. The silicon nitride 24 is anisotropically etched leaving a composite spacer 26 (which is the combination of the silicon dioxide 22 and silicon nitride 24) alongside each of the stacks S1 and S2. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). The resultant structure is shown in FIG. 1D.

A layer of oxide is formed over the structure, followed by an anisotropical etch leaving spacers 30 of the oxide alongside the stacks S1 and S2. A photoresist 28 is formed over the regions between the stacks S1 and S2, and other alternating pairs of stacks S1 and S2. For the purpose of this discussion, the region between the pair of stacks S1 and S2 will be called the "inner region" and the regions outside of the inner region (i.e. between adjacent pairs of stacks S1 and S2) will be referred to as the "outer regions". The exposed spacers 30 in the outer regions are removed by isotropic etch. The resulting structure is shown in FIG. 1E.

After the photoresist 28 is removed, the exposed portions first polysilicon 14 in the inner and outer regions are anisotropically etched. Part of oxide layer 12 will also be etched (removed) during the poly over-etching. A thinner layer of remaining oxide will preferably stay on the substrate 10 so as to prevent damage to the substrate 10. The resultant structure is shown in FIG. 1F.

A layer of oxide is formed over the structure, followed by an anisotropical etch leaving spacers 31 of the oxide alongside the stacks S1 and S2 and a layer 33 of oxide on substrate 34. Another oxide layer is formed over the structure, thickening spacers 31 and layer 33. Photoresist material 32 is then formed and masked leaving openings in the inner regions between the stacks S1 and S2. Again, similar to the drawing shown in FIG. 1E, the photoresist is between other alternating pairs of stacks. The resultant structure is subject to an ion implant (i.e. into exposed portions of substrate 10) forming source regions 34 therein (i.e. regions of conductivity type different than that of the substrate). The oxide spacers 31 adjacent to the stacks S1 and S2 and oxide layer 33 in the inner region are then removed by e.g. a wet etch. The resultant structure is shown in FIG. 1G.

The photoresist material 32 in the outer regions of the stacks S1 and S2 is removed. A high-temperature thermal annealing step is applied to activate the ion implant and to complete the formation of the source junction (i.e. first or source region 34). Silicon dioxide 36 is then formed everywhere. The structure is once again covered by photoresist material 38 and a masking step is performed exposing the outer regions of the stacks S1 and S2 and leaving photoresist material 38 covering the inner region between the stacks S1 and S2. An oxide anisotropical etch followed by isotropic wet etch are performed, to remove oxide 36 and oxide 33 from the outer regions of stacks S1 and S2, and possibly to reduce the thickness of the oxide spacers 31 in the outer regions of the stacks S1 and S2. The resultant structure is shown in FIG. 1H. Each stack includes a floating gate 14 disposed over and insulated from the substrate, and a control gate 18 formed over and insulated from the floating gate 14. The inner region (between stacks S1 and S2) includes a tunnel oxide 36 formed on the substrate and along the sidewalls of the stacks S1 and S2).

An oxide layer is formed on the surface of the substrate (or some of oxide 33 is left remaining after the previous oxide etch). After the photo resist 38 is removed, a polysilicon layer is formed over the structure, followed by the formation of a blocking oxide layer 44 on the poly layer 42. The resulting structure is shown in FIG. 1I, which is an expanded view showing the memory cell areas 46 (i.e., those area(s) of the wafer in which memory cells will be formed), LV (low voltage) logic device areas 48 (i.e., those area(s) of the wafer die in which the low voltage logic devices will be formed), and HV (high voltage) logic device areas 50 (i.e., those area(s) of the wafer die in which the high voltage logic devices will be formed). Areas 46, 48, 50 are separated from each other by STI insulation regions 52 (insulation filled trenches formed into the substrate).

Photoresist 54 is formed over the structure, and patterned using photolithography and a photoresist etch so that the photoresist only remains in the LV logic device area 48. An oxide etch is then performed to remove the blocking oxide from the memory cell area(s) 46 and the high voltage logic device area(s) 50, as illustrated in FIG. 1J. After the photo resist 54 is removed, a second layer of polysilicon 56 is deposited over the structure, which thickens the poly 42 in the memory cell area(s) 46 and the HV logic device area(s) 50, and results in dummy poly 56 over the blocking oxide 44 in the LV logic device area(s) 48, as illustrated in FIG. 1K.

A poly CMP (chemical-mechanical polish) etch is performed to reduce the thickness of the combined logic poly 42 and dummy poly 56, as illustrated in FIG. 1L. A further poly etch reduces the thickness of the poly 42 in the memory cell area(s) 46 and HV logic device area(s) 50, but this thickness (e.g. 1000A or thicker) is greater than the thickness of the poly 42 under the blocking oxide 44 in the LV logic device area(s) 48. All of the dummy poly 56 over blocking oxide is removed by this poly etch. The resulting structure is shown in FIG. 1M.

An oxide etch is used to remove the blocking oxide 44. An N+ poly pre-doping implant can be performed (e.g. arsenic or phosphorus). Photo resist 58 can be formed and used to block this implant in those regions that it is not desired (e.g. P-tab/P-well pick-up), as illustrated in FIG. 1N.

After the photo resist 58 is removed, new photo resist 60 is formed over the structure, and patterned using photolithography and photo resist etch to remove the photo resist 60 except for the memory cell, LV logic device and HV logic device areas 46, 48, 50. A poly etch is then used to pattern the poly 42 by removing the exposed portions of poly 42, leaving blocks of the poly 42a and 42b in the memory cell area(s) 46 that are the select gates and the erase gates respectively for the memory cells, leaving blocks of the poly 42c in the LV logic device area(s) 48 that are the conductive gates for the LV logic devices, and leaving blocks of the poly 42d in the HV logic device area(s) 50 that are the conductive gates for the HV logic devices. The thicknesses (height) of the select/erase gate poly blocks 42a/42b and HV logic device gate poly blocks 42d are greater than that of the LV logic device gate poly blocks 42c, as shown in FIG. 1O.

After the photo resist 60 is removed, and after an optional poly re-ox process is performed, memory cell LDD and LV logic device LDD implants are performed to form the drain regions 62 in the memory cell area(s) 46 and the source/drain regions 64/66 in the LV logic device area(s) 48. Then, photo resist 68 is formed over the memory cell and LV logic device areas 46/48, leaving the HV logic device area(s) 50 exposed. A HV logic device LDD implant is performed to form the high voltage source/drain regions 70/72 in the HV logic device area(s) 50. The relatively thick gate poly 42d in the HV logic device area(s) 50 prevents penetration of the implant into the underlying channel regions under poly 42d. The resulting structure is shown in FIG. 1P.

Figure 2A:
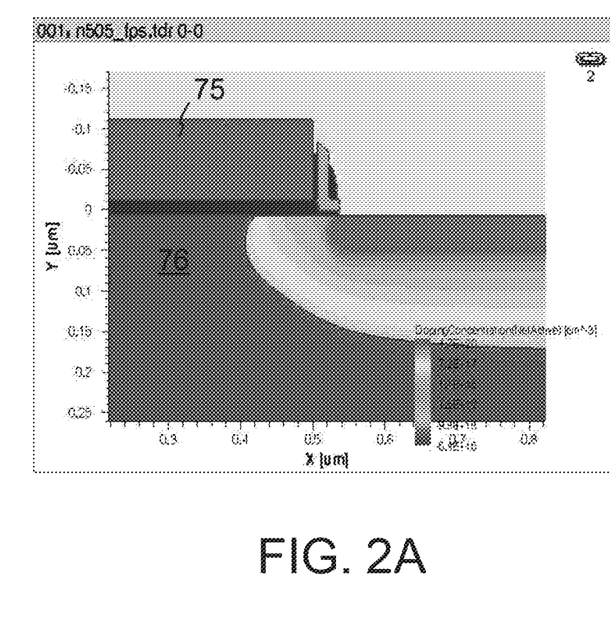
FIG. 2A is a side cross sectional view of a simulation illustrating the desirable implantation that results from a sufficiently thick HV gate.
Figure 2B:
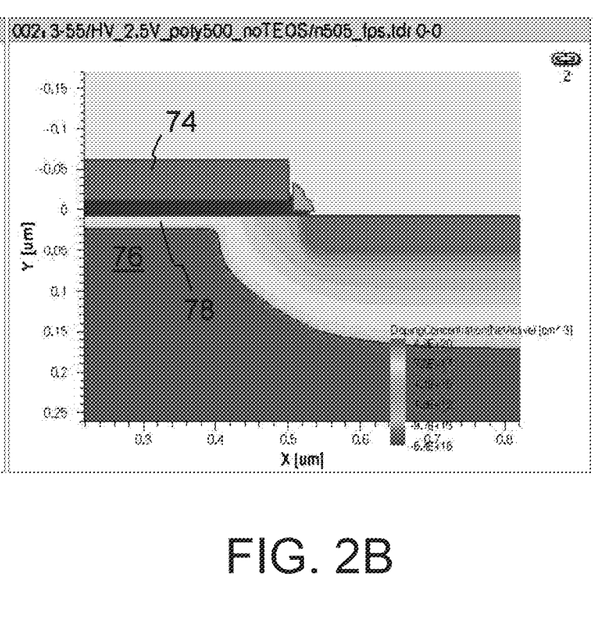
FIG. 2B is a side cross sectional view of a simulation illustrating the undesirable implantation that results from an insufficiently thick HV gate.

Simulations show that the added thickness of the HV logic device poly gate effectively prevents undesirable implant penetration of the poly gate into the channel region. As shown in FIG. 2B, using a 500 Å thick poly gate 74 and a phosphorous implant, some of the phosphorous penetrated the poly gate 74 and was implanted into the channel region 76 under the poly gate 74 (see channel implant 78). However, as shown in FIG. 2A, using the same implant energy, a 1000A thick poly gate 75 effectively blocked the implant from reaching the channel region 76. Moreover, the thicker poly gate in the HV logic device area(s) is formed using the same poly processing steps as that for forming the poly gates in the LV logic device area(s) and the memory cell select gates.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the pairs of memory cells and associated logic devices. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory device, comprising:
   providing a silicon substrate, wherein the substrate has a memory area, an LV area and an HV area which are insulated from each other by insulation material extending into a surface of the substrate, and wherein the substrate has a first conductivity type;
   forming pairs of spaced apart memory stacks on the substrate and in the memory area, wherein each memory stack includes:
      a floating gate disposed over and insulated from the substrate, and
      a control gate disposed over and insulated from the floating gate;
   forming a first conductive layer over and insulated from the substrate in the memory area, the LV area and the HV area, wherein the first conductive layer extends up and over the pairs of memory stacks;
   forming a first insulation layer on the first conductive layer in the memory area, the LV area and the HV area;
   removing the first insulation layer from the memory area and the HV area, while maintaining the first insulation layer in the LV area;
   performing a conductive material deposition to thicken the first conductive layer in the memory area and the HV area, and to form a second conductive layer on the first insulation layer in the LV area;
   performing an etch to thin the first conductive layer in the memory area and the HV area, and to remove the second conductive layer in the LV area, wherein a top surface of the first conductive layer in the memory area and the HV area is higher than a bottom surface of the first insulation layer in the LV area;
   removing the first insulation layer from the LV area; and
   patterning the first conductive layer to form blocks of the first conductive layer in the memory area, the LV area and the HV area, wherein the blocks of the first conductive layer in the LV area have a height less than that of the blocks of the first conductive layer in the HV area.

2. The method of claim 1, further comprising:
   performing a first implantation to form regions in the memory and LV areas of the substrate having a second conductivity type different than the first conductivity type; and
   performing a second implantation to form regions in the HV area of the substrate having a second conductivity type different than the first conductivity type.

3. The method of claim 2, wherein an implant energy of the second implantation is greater than an implant energy of the first implantation.

4. The method of claim 2, further comprising:
   forming photo resist over the substrate in the memory area and the LV area before the second implantation, wherein the photo resist blocks the second implantation from the memory area and the LV area.

5. The method of claim 2, wherein the regions of second conductivity type in the memory and LV areas have a lower breakdown voltage than a breakdown voltage of the regions of second conductivity type in the HV area.

6. The method of claim 1, wherein the performing of the etch to thin the first conductive layer includes a chemical-mechanical polish etch.

* * * * *